(12) United States Patent
Sung et al.

(10) Patent No.: US 10,804,156 B2
(45) Date of Patent: Oct. 13, 2020

(54) TECHNIQUES FOR FORMING DUAL EPITAXIAL SOURCE/DRAIN SEMICONDUCTOR DEVICE

(71) Applicant: Varian Semiconductor Equipment Associates, Inc., Gloucester, MA (US)

(72) Inventors: Min Gyu Sung, Essex, MA (US); Rajesh Prasad, Lexington, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 140 days.

(21) Appl. No.: 16/015,889

(22) Filed: Jun. 22, 2018

(65) Prior Publication Data

US 2019/0393094 A1   Dec. 26, 2019

(51) Int. Cl.
| | | |
|---|---|---|
| *H01L 21/8234* | (2006.01) | |
| *H01L 21/265* | (2006.01) | |
| *H01L 21/308* | (2006.01) | |

(52) U.S. Cl.
CPC ........ *H01L 21/823418* (2013.01); *H01L 21/26586* (2013.01); *H01L 21/308* (2013.01); *H01L 21/823431* (2013.01)

(58) Field of Classification Search
CPC ............ H01L 29/66795; H01L 21/845; H01L 21/823814; H01L 21/823821; H01L 21/823864; H01L 29/0653; H01L 29/4238; H01L 29/7855; H01L 29/66545; H01L 21/823431; H01L 21/823481; H01L 21/823468; H01L 21/84; H01L 21/823807; H01L 27/1203; H01L 29/7848; H01L 27/0924; H01L 21/02126; H01L 21/31116; H01L 21/823418; H01L 21/26586; H01L 21/308
See application file for complete search history.

(56) References Cited

U.S. PATENT DOCUMENTS

| | | | |
|---|---|---|---|
| 7,524,743 B2 * | 4/2009 | Gupta | H01J 37/32412 438/514 |
| 9,443,855 B1 * | 9/2016 | Devarajan | H01L 29/66545 |
| 9,553,093 B1 * | 1/2017 | Seo | H01L 27/0924 |
| 2011/0049630 A1 * | 3/2011 | Majumdar | H01L 21/823807 257/351 |

* cited by examiner

*Primary Examiner* — Stephen W Smoot
*Assistant Examiner* — Vicki B. Booker

(57) ABSTRACT

A method of forming a three-dimensional transistor device. The method may include providing a transistor structure, where the transistor structure includes a fin assembly, a gate assembly, the gate assembly disposed over the fin assembly and comprising a plurality of gates, a liner layer, disposed over the plurality of gates, and an isolation layer, disposed subjacent the liner layer. The method may also include directing first angled ions at the transistor device, wherein a first altered liner layer is created in the liner layer, wherein, in the presence of a liner-removal etchant, the liner layer exhibits a first etch rate, the first altered liner layer exhibits a second etch rate, greater than the first etch rate.

18 Claims, 7 Drawing Sheets

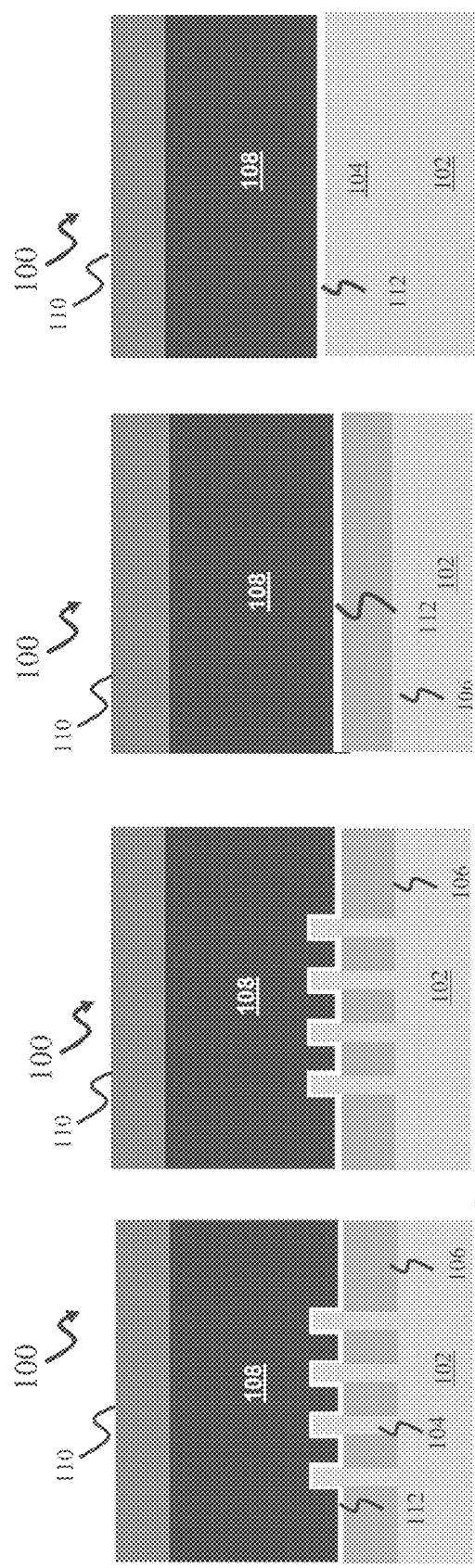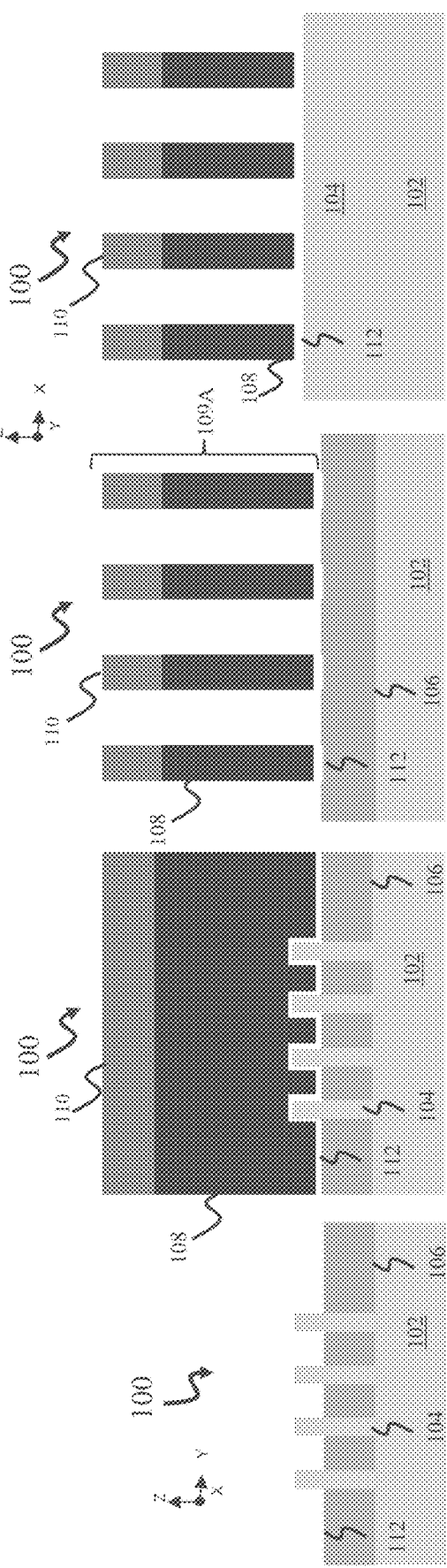

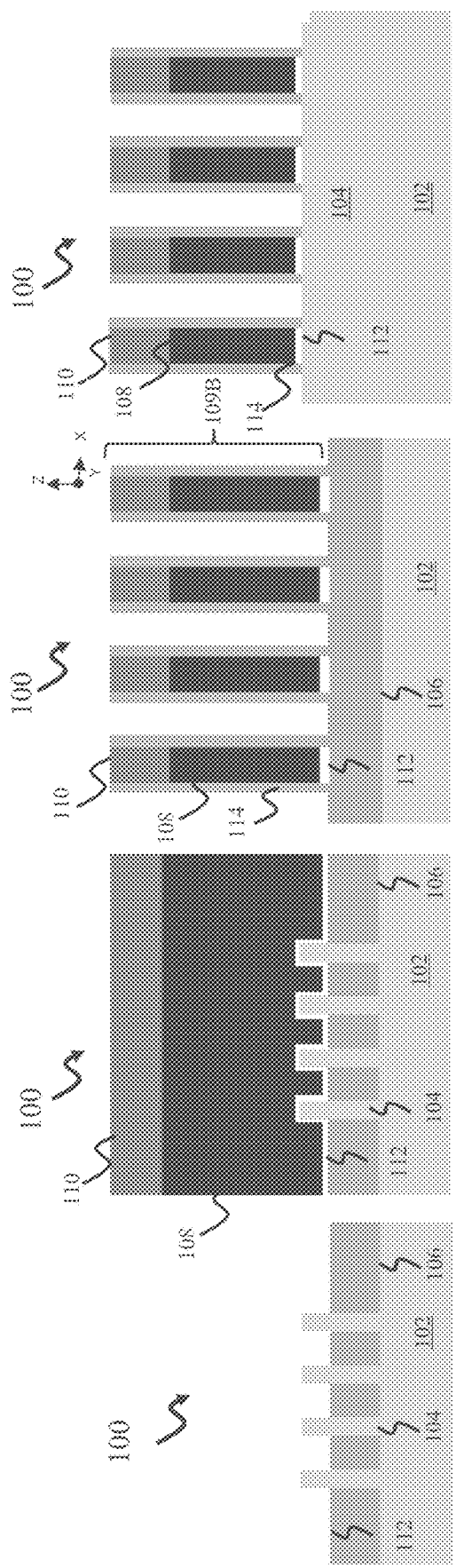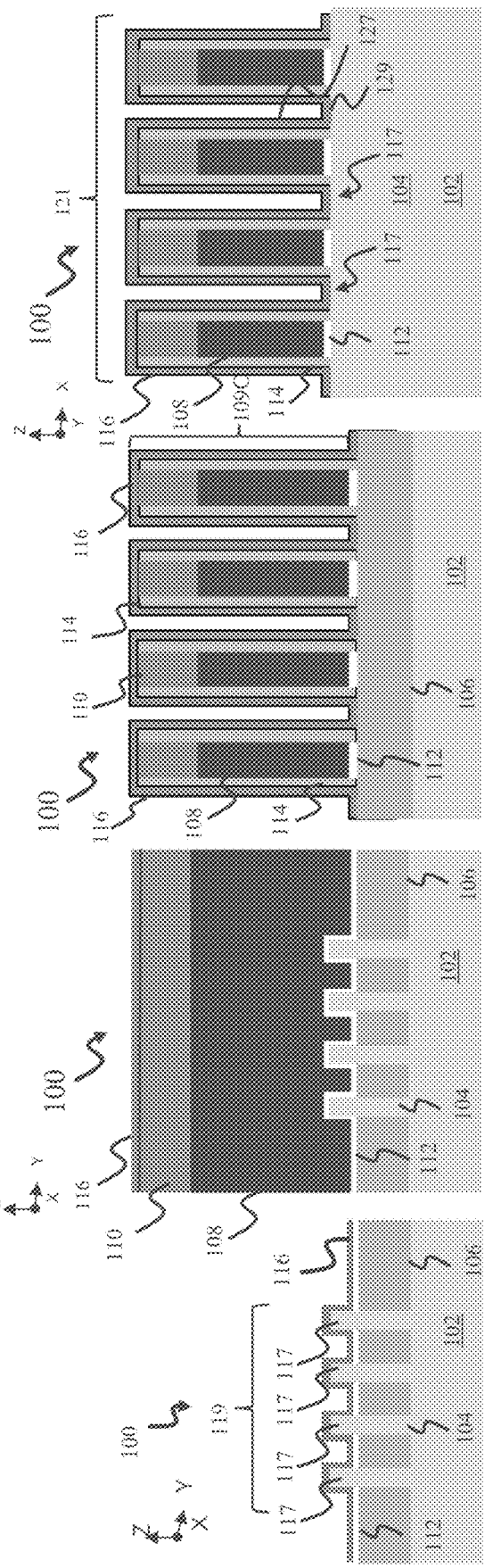

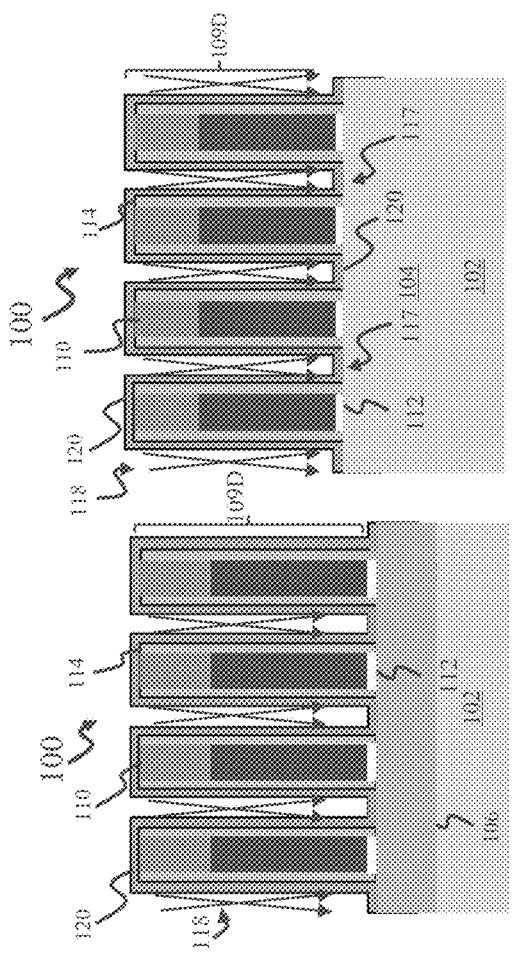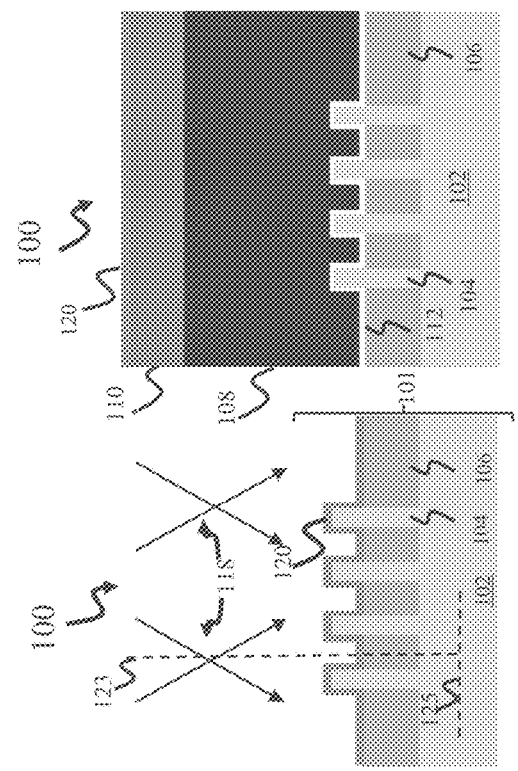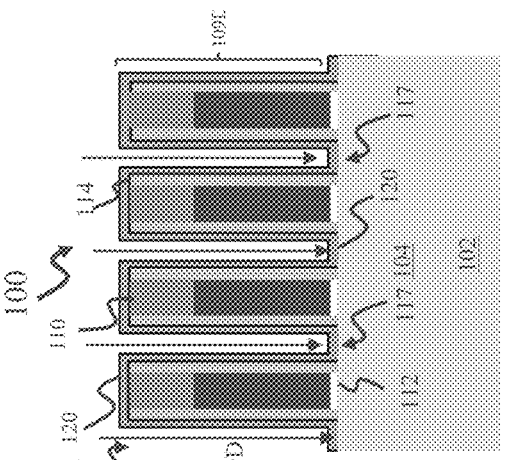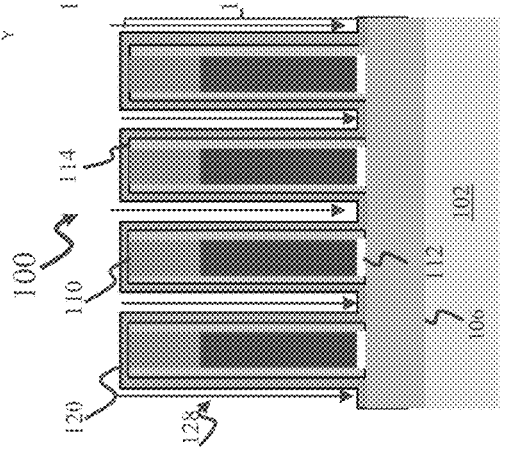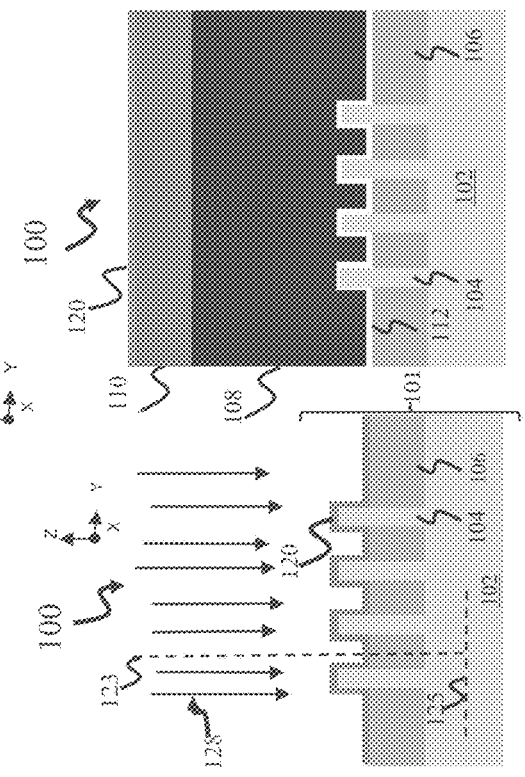

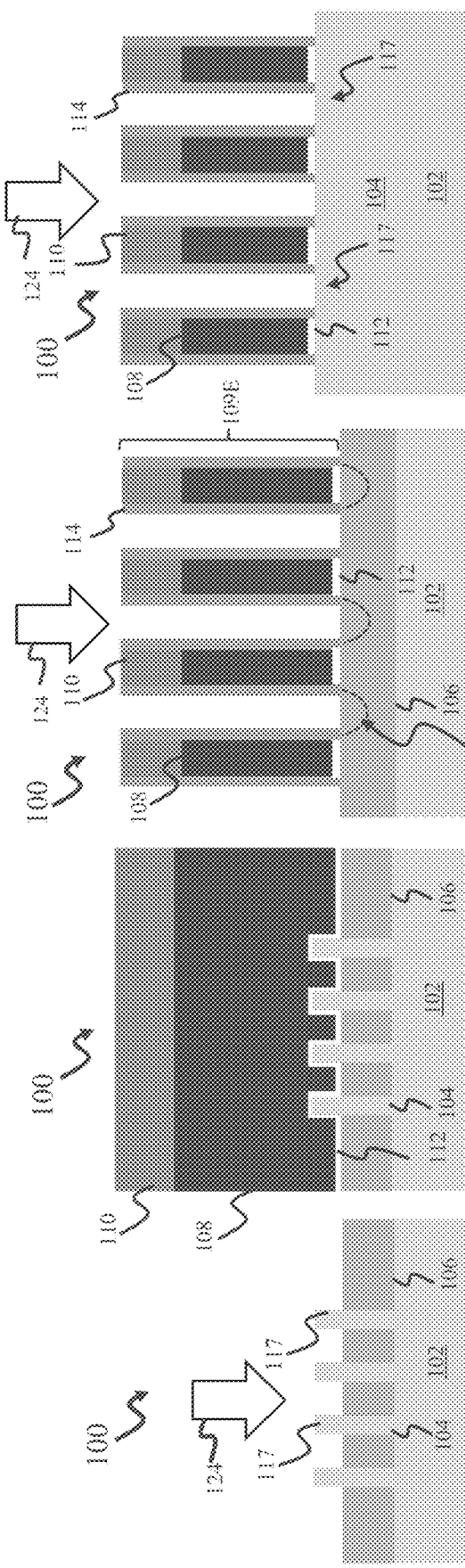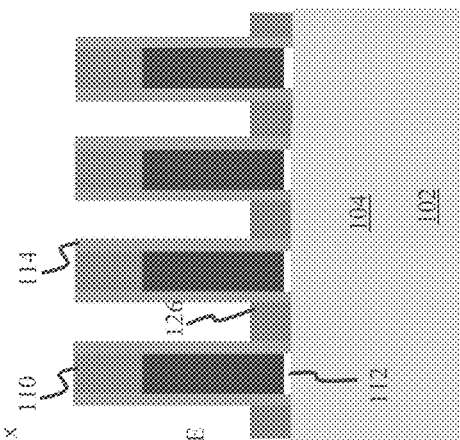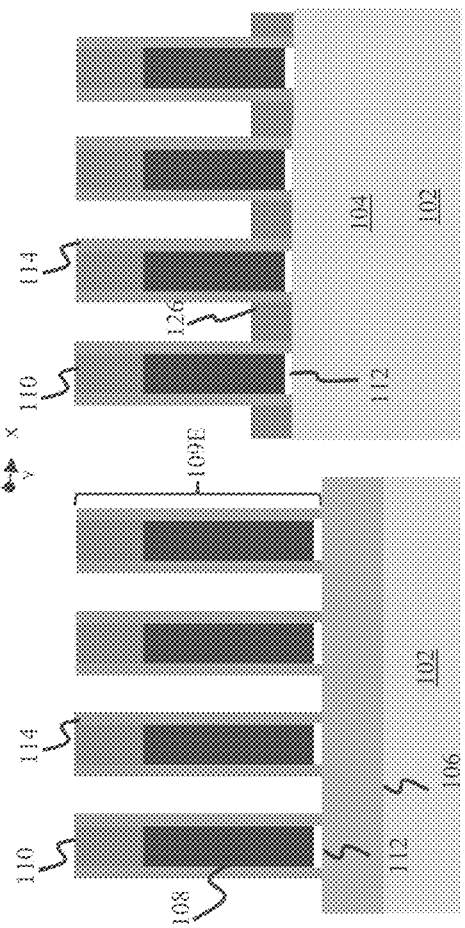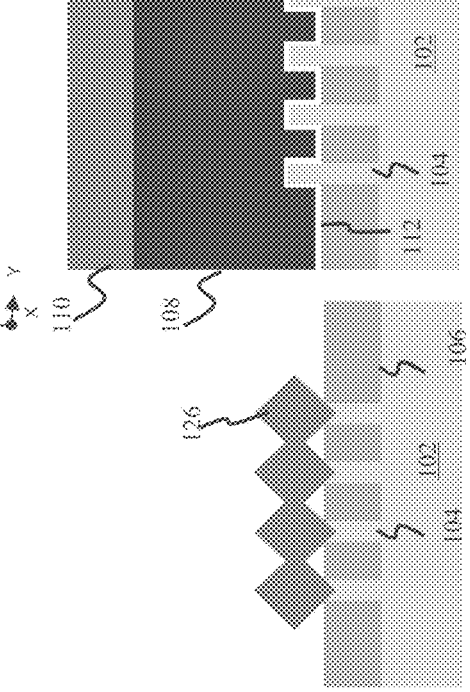

TECHNIQUES FOR FORMING DUAL EPITAXIAL SOURCE/DRAIN SEMICONDUCTOR DEVICE

FIELD

The present embodiments relate to semiconductor device structures, and more particularly, to structures and processing for three dimensional transistor devices.

BACKGROUND

As semiconductor devices scale to smaller dimensions, the ability to harness device improvements with decreased size becomes more challenging. For complementary metal oxide semiconductor (CMOS) devices, one approach to improve device performance is to grow epitaxial raised source/drain (RSD) regions, where the RSD region may be designed to enhance device performance by altering the strain state in the semiconductor material near the transistor channel. One known approach is to grow a silicon silicon: germanium alloy (SiGe) layer as a RSD region, above a monocrystalline silicon layer in a P-type field effect transistor (PFET) region of the CMOS device. The approach imparts compressive stress into the adjacent silicon channel, resulting in higher hole mobility in the PFET device. In the N-type field effect transistor (NFET) regions, compressive strain in the transistor channel is not desirable, since compressive strain does not raise n-channel mobility. Accordingly, in NFET regions, a raised source/drain region may be formed using silicon, rather than SiGe because compressive strain in a silicon channel of an NFET is not desired. Such a dual epitaxial scheme where two heterogeneous RSD regions are formed, where one RSD region may be formed from SiGe and the other region formed from Si, may entail four separate wet etch operations to clear liners formed in PFET regions and NFET regions. As a consequence, the wet etch operations may inadvertently attack other regions of the transistor device, such as isolation regions. In the case of fin-type FETS (or finFETs), isolation regions between gate structures of a finFET may be undercut during the etching operations performed in conjunction with formation of RSD regions in the PFET and NFET regions. For this reason, a robust, dual epitaxial process for forming RSD regions in finFET CMOS devices has not been implemented heretofore.

With respect to these and other considerations, the present disclosure is provided.

BRIEF SUMMARY

In an embodiment a method of forming a three-dimensional transistor device may include providing a transistor structure. The transistor structure may include a fin assembly, a gate assembly, the gate assembly disposed over the fin assembly and comprising a plurality of gate structures, a liner layer, disposed over the plurality of gate structures, and an isolation layer, disposed subjacent the liner layer. The method may include directing first angled ions at the transistor structure, wherein a first altered liner layer is created in a first portion of the liner layer, wherein, in the presence of a liner-removal etchant, the liner layer exhibits a first etch rate, the first altered liner layer exhibits a second etch rate, greater than the first etch rate.

In a further embodiment, a method of forming a three-dimensional transistor device may include forming a first silicon nitride layer on a transistor structure of a fin-type field effect transistor device, wherein the first silicon nitride liner layer comprises a gate sidewall portion, and a bottom portion. The method may also include directing first angled ions at the transistor structure, wherein the first angled ions implant into the gate sidewall portion and the bottom portion, wherein a first altered liner layer is created in the sidewall portion and the bottom portion. The method may further include performing a first block lithography operation, wherein a first portion of the transistor structure, comprising device structures of a first polarity is unmasked, and wherein a second portion, comprising device structures of a second polarity is masked. The method may also include exposing the transistor structure to a liner-removal etchant, wherein the first altered liner layer is removed in the first portion, and performing a first epitaxial source/drain growth operation, wherein a first semiconductor material is grown on source/drain regions of the first portion.

In a further embodiment, a method of forming a three-dimensional transistor device, may include performing a forming a first silicon nitride liner layer on a transistor structure of a fin-type field effect transistor device, wherein the first silicon nitride liner layer comprises a gate sidewall portion, and a bottom portion. The method may further include directing first angled ions in a first ion exposure at the transistor structure, wherein a first altered liner layer is created in the first silicon nitride layer. The first altered liner layer may include implanted species derived from the first angled ions, wherein the implanted species exhibit a concentration of 5 E20/cm$^3$ to 1 E22/cm$^3$. The method may include performing a first block lithography operation, wherein a first portion of the transistor structure, comprising device structures of a first polarity is unmasked, and wherein a second portion, comprising device structures of a second polarity is masked. The method may include exposing the transistor structure to a liner-removal etchant, wherein the first altered liner layer is removed in the first portion of the transistor structure.

BRIEF DESCRIPTION OF THE DRAWINGS

FIG. 2A to FIG. 2D depict respective side cross-sectional views of the semiconductor device structure of FIG. 1A to FIG. 1D, at another stage of fabrication;

FIG. 3A to FIG. 3D depict respective side cross-sectional views of the semiconductor device structure of FIG. 1A to FIG. 1D, at another stage of fabrication;

FIG. 4A to FIG. 4D depict respective side cross-sectional views of the semiconductor device structure of FIG. 1A to FIG. 1D, at another stage of fabrication;

FIG. 5A to FIG. 5D depict respective side cross-sectional views of the semiconductor device structure of FIG. 1A to FIG. 1D, at another stage of fabrication;

FIG. 6A to FIG. 6D depict respective side cross-sectional views of the semiconductor device structure of FIG. 1A to FIG. 1D, at another stage of fabrication;

FIG. 7A to FIG. 7D depict respective side cross-sectional views of the semiconductor device structure of FIG. 1A to FIG. 1D, at another stage of fabrication;

FIG. 8A to FIG. 8D depict respective side cross-sectional views of the semiconductor device structure of FIG. 1A to FIG. 1D, at another stage of fabrication;

FIG. 9A to FIG. 9D depict respective side cross-sectional views of the semiconductor device structure of FIG. 1A to FIG. 1D, at another stage of fabrication;

DETAILED DESCRIPTION

Figure 1D:
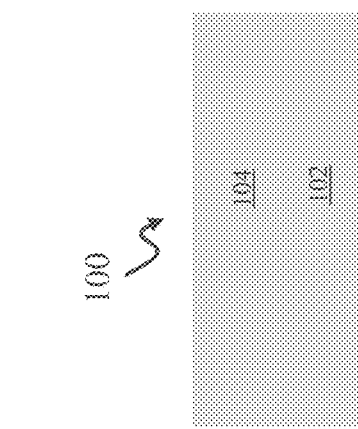
FIG. 1A to FIG. 1D depict side different cross-sectional views of a semiconductor device structure, at one stage of fabrication, according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques to form semiconductor devices, including three-dimensional transistors, formed in a semiconductor substrate. As is known, three dimensional transistors, such as finFET transistors, may be arranged in circuitry to form various types of logic devices, as well as memory devices. A finFET structure implemented in a CMOS architecture may be referred to herein as a "finFET CMOS t device" where the finFET CMOS device includes both NFET and PFET transistor regions. In various embodiments, techniques are provided for implementation in a replacement gate process.

Figure 1E:
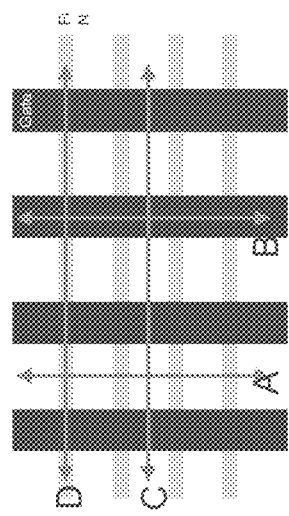
FIG. 1E depicts a top plan view of one embodiment of the device structure of FIGS. 1A-1D, with various details omitted, illustrating the location of the cross-sectional views of FIG. 1A to FIG. 1D.
Figure 1C:
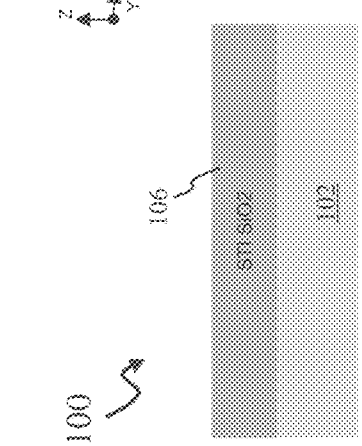
Figure 1B:
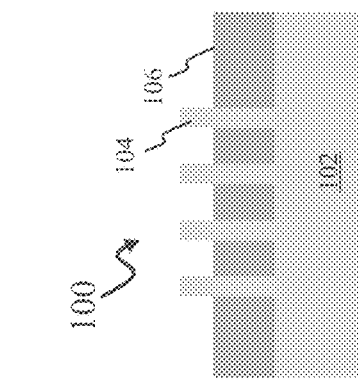
Figure 1A:
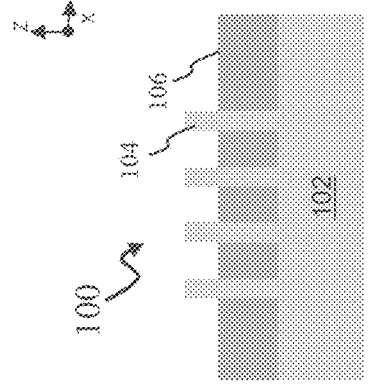

Turning now to FIG. 1A to FIG. 1D there are shown different side cross-sectional views of a semiconductor device structure 100, at one stage of fabrication, according to embodiments of the disclosure. FIG. 1E depicts a top plan view of one embodiment of the device structure of FIGS. 1A-1D, with various details omitted, illustrating the location of the cross-sectional views of FIG. 1A to FIG. 1D. The cut along the A-A section of FIG. 1A illustrates the structure of the semiconductor device structure 100 along an active P-type region, intersecting two adjacent gate regions. The cut along the B-B section of FIG. 1B is parallel to the A-A cut, while located off the active regions, along isolation structures. The cut along the C-C section of FIG. 1C is located along a gate structure, orthogonal to the A-A cut, intersecting two different active regions, a PFET region, and an NFET region, as shown. The cut along the D-D section is parallel to the C-C section and intersects two active regions, while not along a gate. The same convention shown in FIG. 1E as described with respect to FIGS. 1A-1D also applies to the various views of the respective FIGS. 2A-2D, 3A-3D, . . . 9A-9D to follow. Notably, the sequence of operations shown in FIGS. 1A-8D to follow may apply to processing of a PFET region, or alternatively to an NFET region. As such, to complete a CMOS formation process, the set of operations generally depicted in the flow between FIGS. 1A-8D may be performed once to form transistors in a PFET region, and may be repeated to form an NFET region, allowing for slight variations, as noted below.

At the instance of FIG. 1A the device structure represents an intermediate stage of formation of a three-dimensional transistor device, in particular, a CMOS finFET device, generally fabricated according to known approaches, at least to the stage shown in FIG. 1A. In FIG. 1A, the semiconductor device structure 100 has been fabricated to the point where fins 104 have been fabricated from a semiconductor base 102, where the semiconductor base 102 may be monocrystalline semiconductor, such as silicon. The fins 104 may be fabricated monolithically from the semiconductor base 102, as in known processes. An isolation layer 106 has also been fabricated, and etched back, wherein the fins 104 protrude above the isolation layer 106, to form active portions of transistors to be fabricated in the semiconductor device structure 100.

Turning to FIGS. 2A-2D, there is shown a subsequent instance after a gate stack has been formed on the structure of FIG. 1A. The gate stack may include a stopping layer 112, dummy poly-Si gate 108, as well hardmask 110. These layers of the gate stack may be known materials, arranged for patterning into a dummy gate, for example.

Turning to FIGS. 3A-3D, there is shown a subsequent instance the gate stack is patterned into gate structures 109A.

Turning to FIGS. 4A-4D, there is shown a subsequent instance where a gate spacer is formed along sidewalls of the gate structures, forming gate structures 109B. the gate spacer(s) 114 may be formed of known materials, such as silicon nitride (SiN), silicon boron carbon nitride (SiCBN), silicon oxygen carbon nitride (SiOCN). The embodiments are not limited in this context. Such a gate spacer may be used to define regions for epitaxial growth of a subsequently-formed raised source/drain structure, as well as to define source/drain extension regions.

Subsequently to the operations of FIGS. 4A-4D, FIGS. 5A-5D illustrate an instance after the formation of a liner layer 116. The liner layer 116 may be deposited in a conformal manner by known processes. In various embodiments, the liner layer 116 may be silicon nitride. Exemplary thickness of the liner layer 116 may be in the range between 1 nm and 5 nm. In some embodiments, the thickness of the liner layer 116 may be in the range of 2 nm to 3 nm.

As such, the semiconductor device structure 100 of FIGS. 5A-5D forms a transistor structure including a fin assembly 119 composed of the fins 104, and a gate assembly 121 composed of a plurality of gate structures 109C, where the gate assembly 121 is disposed over the fin assembly 119. At this stage of formation, the first fin liner 116 is disposed over the gate structures 109C, including over a gate sidewall portion 127, and over a bottom portion 129. As such, the liner layer 116 may function to protect source/drain regions 117 of the device during an epitaxial raised source/drain process, so as to prevent unwanted growth of a raised/source drain. In other words, given for the sake of argument the semiconductor device structure 100 represents a PFET region of a finFET CMOS device, the liner layer 116 is also deposited on source/drain regions 117 of an analogous NFET region, exhibiting the same general structure as depicted in FIG. 5D, for example. The deposition of the liner layer 116 over source/drain regions 117 in the NFET region may serve to prevent epitaxial growth of a RSD structure in the NFET region during growth of the RSD structure in the desired, PFET region, as depicted below at FIGS. 8A-8D.

Subsequently to the operation of FIGS. 5A-5D, FIGS. 6A-6D illustrate an operation of directing first angled ions 118 at the transistor device, meaning the semiconductor device structure 100. As such, a first altered liner layer 120 may be created in the liner layer 116. The first altered liner layer 120 may consume the entirety of the thickness of the liner layer 116. In other words, the liner layer 116 may be transformed into the first altered liner layer 120 after exposure to the first angled ions 118. As detailed below, with suitable selection of species for the first angled ions 118, as well as suitable ion energy and ion dose, the first altered liner layer 120 may exhibit a higher etch rate in a given liner-removal etchant, as compared to the liner layer 116. This increase in etch rate for the first altered liner layer 120 may be harnessed to generate an improved device structure after formation of epitaxial raised source/drains. In brief, the liner layer 116 may exhibit a first etch rate, while the first altered liner layer 120 exhibits a second etch rate, greater than the first etch rate, in some embodiments two times the first etch rate, three times the first etch rate, five times the first etch rate, or greater.

As shown in FIG. 6A, the first angled ions 118 may form a non-zero angle of incidence (θ) with respect to a perpendicular 123 to a plane 125 of the substrate. In various embodiments a value of the non-zero angle of incidence may range between 10 degrees and 80 degrees. The embodiments are not limited in this context. As detailed below, the first angled ions 118 may be arranged to implant into the liner layer 116 in a manner altering the properties of the liner layer 116. Thus, the ion energy and the ion dose of first angled ions 118 may be arranged to alter the characteristic of the liner layer 116, wherein the first altered liner layer 120 is generated.

According to some embodiments, the first angled ions 118 may be provided using a known beamline ion implanter, where the substrate 101 containing the semiconductor device structure 100 is tilted with respect to an ion beam. The substrate 101 may be tilted in different exposures to provide first angled ions 118 from opposite directions, as suggested in FIG. 6A. In other embodiments, the first angled ions 118 may be provided using a compact ion beam source, such as a plasma chamber equipped with an extraction plate, arranged to direct an angled ion beam to the substrate 101, as known in the art. Notably, the substrate 101 may be rotated within the plane 125, about the perpendicular 123 to facilitate exposure of different portions of the liner layer 116.

In some embodiments, in addition to the exposure to the first angled ions 118, an additional exposure to vertical ions may be provided, to ensure altering the liner layer 116 in regions, such as in the source/drain regions 117. FIGS. 7A-7D illustrate an optional operation wherein vertical ions 128 are directed, generally along the perpendicular 123 to expose regions of the liner layer 116, such as near the source/drain regions 117. This operation may be performed before or after the operation of FIGS. 6A-6D. Notably, depending upon the aspect ratio of trenches formed between the gate structures 109D, the operation of FIG. 7A may or may not be performed.

Subsequently to the operation of FIGS. 6A-6D, and FIGS. 7A-7D, FIGS. 8A-8D illustrate an operation where the semiconductor device structure 100 is subjected to a liner-removal etchant 124. The operation shown in FIGS. 8A-8D may be used to prepare the semiconductor device structure 100 for growth of a raised source/drain structure in the source/drain regions 117, as discussed above. As an example, the liner-removal etchant 124 may be a wet etchant providing isotropic etching, such as a dilute HF solution or other known solution. As such, the liner-removal etchant 124 may be provided to remove the first altered liner layer 120. Because the first altered liner layer 120 exhibits an enhanced etch rate as compared to the etch rate for the liner layer 116, the liner-removal etchant 124 may be provided in a reduced etch process, where the etch conditions, such as etch time are reduced as compared to etchant conditions to etch the liner layer 116, in unaltered condition. As such, when the first altered liner layer 120 is removed, the isolation layer 106 may be better preserved, as compared to known processes. For example, the liner layer 116 may be formed of silicon nitride while the isolation layer 106 is formed of silicon oxide. As such, and etchant such as DHF may etch the isolation layer 106 at a comparable rate to the etch rate for etching the liner layer 116, in an unaltered state. In known processing approaches, before epitaxial growth in a source/drain region, where an unaltered silicon nitride liner layer is removed by wet etching, undue etching of a subjacent oxide layer may occur due to the comparable etch rate between unaltered silicon nitride and silicon oxide. This known approach may produce the reference profile 122, where the isolation layer 106 is substantially etched, including undercut of the gate structures 109D. When severe, the overetching represented by reference profile 122 may cause gate bending and device loss. By generating the first altered liner layer 120, the etch time may be substantially reduced to remove the liner over source/drain regions 117, as well as the liner on sidewalls of the gate structures 109D. This reduced etch time may ensure little or no etching of the isolation layer 106 occurs, as shown in FIG. 8C.

Subsequently to the operation of FIGS. 8A-8D, FIGS. 9A-9D illustrate an operation where a first epitaxial source/drain growth operation is performed, wherein a first semiconductor material 126 is grown on source/drain regions 117 of a first portion of a CMOS device, either PFET regions or NFET regions. In the case of a PFET, the semiconductor material 126 may be composed of SiGe, to impart higher mobility in the PFET devices formed, as discussed previously. Notably, the operations of FIGS. 1A-9D may be repeated to form raised source drain regions in a second portion of a CMOS device, such as an NFET. Thus, a silicon nitride liner layer may be redeposited on the semiconductor device structure, while the PFET regions are subsequently covered by a lithography mask, and second angled ions are directed toward the silicon nitride liner in the exposed NFET regions. Notably, to form an RSD structure in an NFET, the operation of FIGS. 9A-9D may involve depositing silicon, instead of SiGe. As a whole, the above approach facilitates formation of a dual epitaxial raised source/drain structure in a CMOS finFET, avoiding the undue etching of isolation structures. Table I illustrates a comparison of an exemplary sequence of operations according to some embodiments of the disclosure using angled ions.

TABLE I

| Reference Process Sequence | Angled Ion Process Sequence |
|---|---|
| Gate patterning | Gate patterning |
| Gate spacer formation | Gate spacer formation |
| SiN liner deposition | SiN liner deposition |
|  | First Angled Ion Exposure |
| Block lithography | Block lithography |
| SiN liner-removal on PFET | Reduced Etch SiN liner-removal on PFET |
| Epitaxial RSD on PFET | Epitaxial RSD on PFET |
| SiN liner-removal | SiN liner-removal |
| SiN liner deposition | SiN liner deposition |
|  | Second Angled Ion Exposure |
| Block lithography | Block lithography |
| SiN liner-removal on NFET | Reduced Etch SiN liner-removal on NFET |
| Epitaxial RSD on PFET | Epitaxial RSD on NFET |
| SiN liner-removal | SiN liner-removal |

Figure 1F:
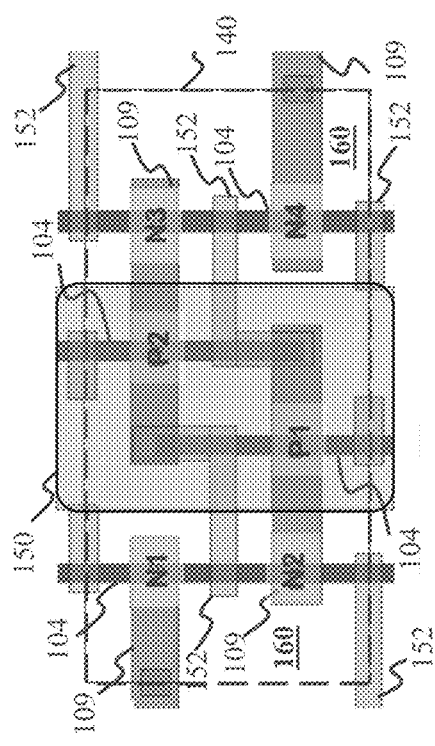
FIG. 1F depicts a top plan view of a variant of the device structure of FIG. 1E.

Table I also shows a reference sequence not employing angled ions. Both sequences employ four different wet etch operations to remove liners, in a dual epitaxial raised source/ drain process. Notably, for a given sequence to grow an epitaxial raised source/drain, a block lithography process is used to cover the FET region where the epitaxy is not to take place. Thus, during a PFET RSD process, block lithography is used to cover the NFET region, so a liner-removal etch just removes the liner from PFET regions. The converse applies to NFET RSD processing. FIG. 1F illustrates a top plan view of an embodiment of the semiconductor device structure 100, implemented in a static RAM (SRAM) 140. A series of gates 109, fins 104, and contacts 152 are shown. The SRAM 140 includes a PFET region 150 (including PFETs P1, P2), coinciding with an N-well, where the PFET region 150 may be unmasked during a PFET RSD process. Thus, the block lithography operation may mask regions 160, outside the PFET region 150, which regions form NFET regions (including NFETs N1, N2, N3, N4). Likewise, the region 160 may be unmasked during a NFET RSD process, while the PFET region 150 is masked.

Notably because the SiN liner is altered by implantation, generating a higher etch rate, the sequence employing angled ions may use a reduced etch process to remove the SiN (altered) liner, thus attacking the subjacent isolation layer to a lesser extent.

Figure 10:
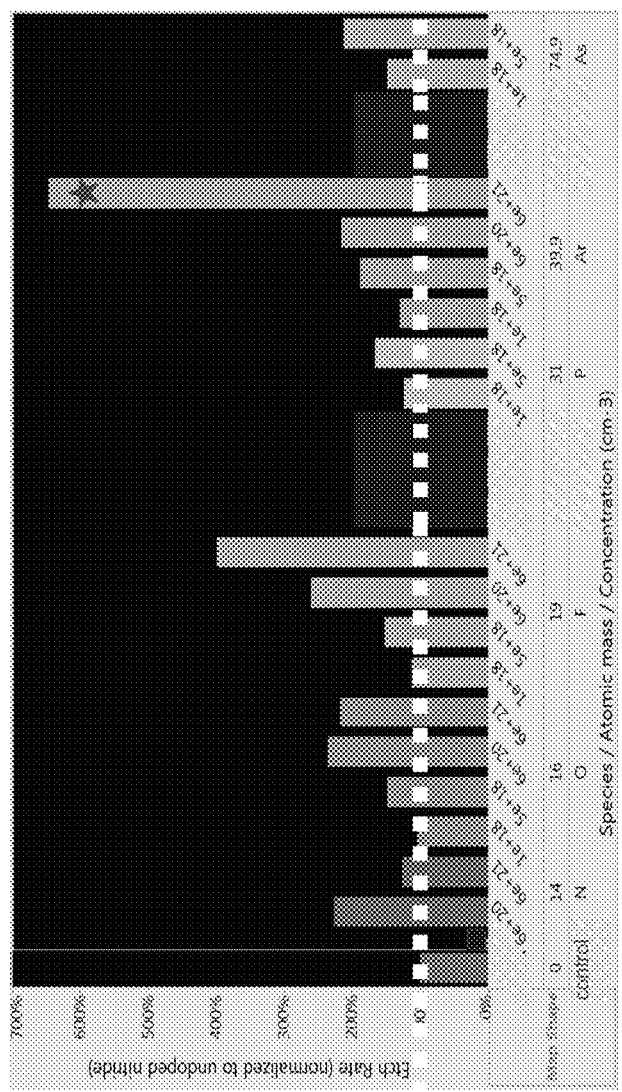
FIG. 10 is a graph depicting exemplary results showing selective enhancement of etch rate of a silicon nitride liner layer after exposure to select species, in accordance with embodiments of the disclosure.

Turning now to FIG. 10, there is shown a graph depicting etch rate for different altered liner layers (having an initial SiN thickness of 200 nm), including exemplary conditions for generating an altered liner layer, in accordance with various embodiments of the disclosure. Specifically, FIG. 10 presents the results for etching of an implanted silicon nitride layer using a DHF solution of 100:1 $H_2O$:HF solution. Such a solution may be appropriate for a liner-removal etch as described above. The etch rate is expressed as a percentage of a reference etch rate for a silicon nitride layer, shown as 100%. The results for various ion species including ions formed from relatively lighter elements, such as nitrogen, oxygen and fluorine, and ions formed from relatively heavier elements, including phosphorous, argon, and arsenic. The composition of the altered silicon nitride liner layer is expressed as a function of concentration of the implanted species (implant species). The concentration of implanted species may be achieved by adjusting the ion dose and ion energy, taking into account layer thickness of the silicon nitride liner layer. As an example, the data for argon implantation yielding a concentration of $6E21/cm^3$ is obtained by performing a series of three implantations: 1) 50 keV ion energy, $2.5E16/cm^2$ ion dose, 2) 20 keV, $5E15/cm^2$, and 3) 7 keV $2.5 E15/cm^2$. Likewise, the data for fluorine implantation yielding a concentration of $6E21/cm^3$ is obtained by performing a series of three implantations: 1) 50 keV energy, $5 E16/cm^2$ ion dose, 20 keV $1E16/cm^2$, and 7 keV $5 E15/cm^2$. These values are merely exemplary. Notably, to achieve the same concentration of implanted species for a thinner liner layer, such as 2 nm SiN, the ion dose and ion energies used for implantation will scale with decreased thickness, and may be much lower than the above examples.

Notably, for oxygen implantation, the etch rate increases to more than 200% the etch rate of unimplanted silicon nitride for a concentration of $6 E20/cm^2$, while the etch rate does not increase further for a concentration of $6E21/cm^2$, exhibiting a value closer to 200% of the unimplanted etch rate. Unexpectedly, for fluorine implantation the etch rate continues to increase up to a value of approximately 400% of the unimplanted etch rate for a concentration of $6 E21/cm^2$. Similarly unexpectedly, for argon implantation the etch rate continues to increase up to a value of approximately 650% of the unimplanted etch rate for a concentration of $6 E21/cm^2$. Notably, the ion dose used to achieve a given concentration of implanted species may be tailored according to the thickness of the liner layer, as will be readily appreciated by those of skill in the art. Thus, a 4-nm thick film may use an ion dose of approximately double the ion dose used for a two-nanometer film. Notably, in embodiments, where the thickness of a liner layer is 4 nm or less, a suitable ion energy, with adjustments for ion mass, may be 2 keV, 1 keV, or 500 eV, for example.

Because the present embodiments facilitate implantation of sidewall portions of a liner layer, the altered liner layer may readily form in the sidewall portions, so the sidewall portions may also be readily removed using an isotropic etch, such as DHF. This removal facilitates subsequent processing where contact material may be formed between gate structures.

Figure 11:
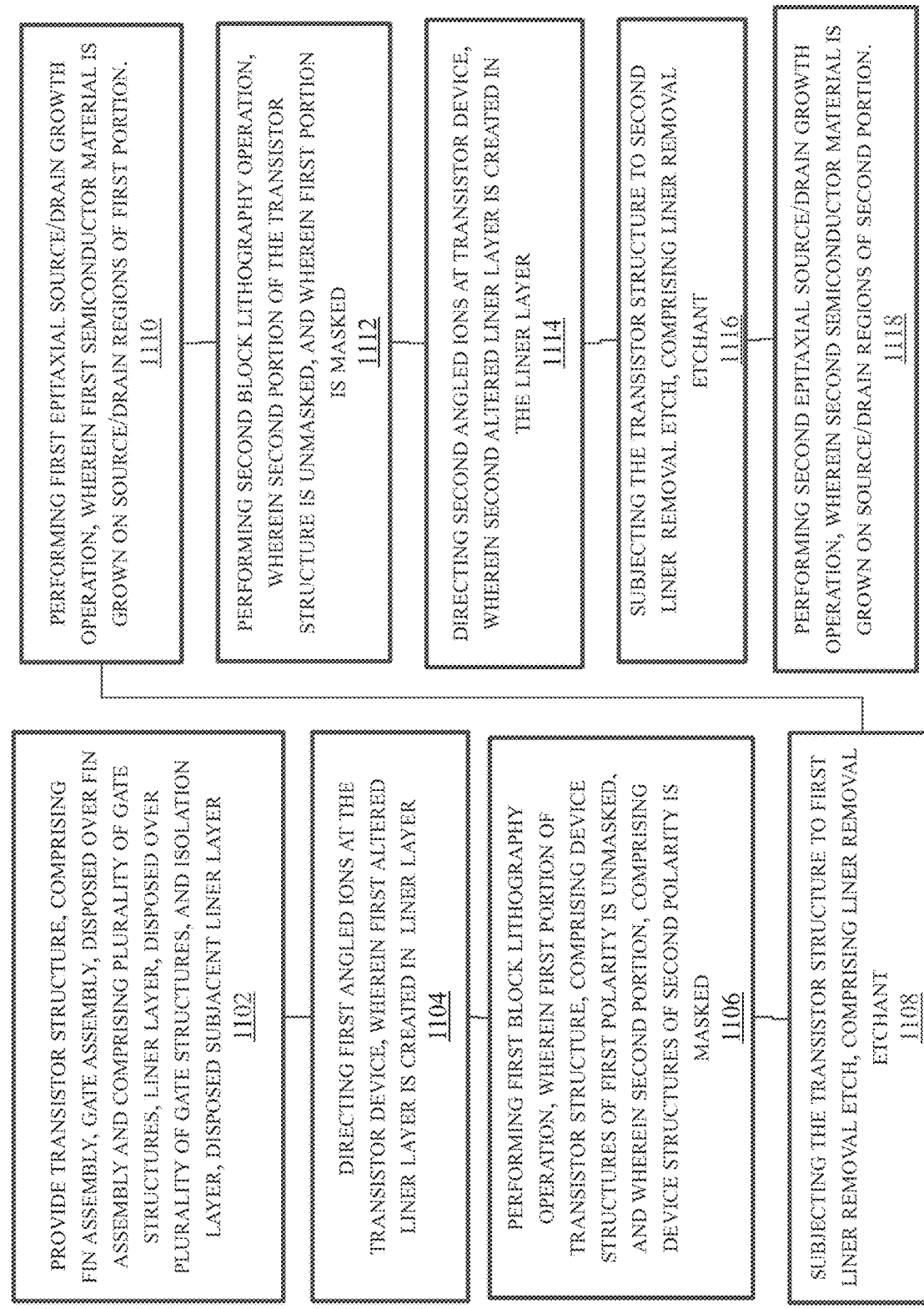
FIG. 11 illustrates an exemplary process flow, according to embodiment of the disclosure.

FIG. 11 depicts an exemplary process flow 1100, according to embodiments of the disclosure. At block 1102, a transistor structure is provided, including a fin assembly, and gate assembly disposed over the fin assembly. The gate assembly may include a plurality of gate structures. The transistor structure may also include a liner layer, such as a silicon nitride liner layer, disposed over the gate structures. In various embodiments the liner layer may have a thickness of 1 nm to 4 nm. The transistor structure may also include an isolation layer, below the liner layer. As such, the transistor structure may be used to grow a raised/source drain structure in select regions of the fin assembly.

At block 1104, first angled ions are directed at the transistor structure, wherein a first altered liner layer is created in a first region of the liner layer. In some embodiments, the first altered liner layer may extend through the thickness of the liner layer. The first altered liner layer may be formed in source/drain regions between gate structures, as well as in sidewall regions along the vertical sides of gate structures.

At block 1106 a first block lithography operation is performed, wherein a first portion of the transistor structure, comprising device structures of a first polarity is unmasked, and wherein a second portion, comprising device structures of a second polarity is masked.

At block 1108, the transistor structure is subject to a first liner-removal etch, comprising a liner-removal etchant. In an example where the liner layer is silicon nitride, the liner-removal etch may use an HF solution such as DHF.

At block 1110, a first epitaxial source/drain growth operation is performed, wherein a first semiconductor material is grown on source/drain regions of the first portion. As an example, for a PFET region, the first semiconductor material may be SiGe.

At block 1112, a second block lithography operation is performed, wherein the second portion of the transistor structure is unmasked, and wherein the first portion is masked.

At block 1114 second angled ions are directed at the transistor device, wherein a second altered liner layer is created in a second region of the liner layer. In some embodiments, the second angled ions may be the same as the first angled ions.

At block 1116, the transistor structure is subject to a second liner-removal etch, comprising a liner-removal etchant, which operation may the same as the first liner-removal etch.

At block 1118, a second epitaxial source/drain growth operation is performed, wherein a second semiconductor material is grown on source/drain regions of the second portion. As an example, for a NFET region, the second semiconductor material may be SiGe.

The present embodiments provide various advantages over known dual epitaxial source/drain processes. For one advantage, the present approaches enable formation of dual epitaxial source/drain regions while not attacking underlying isolation regions, preventing gate bending and related catastrophic device loss. For another advantage, the present embodiments provide a wider process window for liner-removal etching because of the enhanced etch rate of altered liner layers.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming a three-dimensional transistor device, comprising:
    providing a transistor structure, the transistor structure comprising:
        a fin assembly monolithically formed over a semiconductor base,
        a gate assembly, the gate assembly disposed over the fin assembly and comprising a plurality of gate structures,
        a liner layer, disposed over the plurality of gate structures,
        and an isolation layer, disposed subjacent the liner layer and above the semiconductor base; and
    directing first angled ions at the transistor structure, wherein a first altered liner layer is created in a first portion of the liner layer, wherein the first altered liner layer has a second etch rate, the liner layer has a first etch rate, and the second etch rate is greater than the first etch rate relative to a liner removal etchant.

2. The method of claim 1, further comprising:
    performing a first block lithography operation, wherein a first portion of the transistor structure, comprising device structures of a first polarity is unmasked, and wherein a second portion of the transistor structure, comprising device structures of a second polarity is masked; and
    subjecting the transistor structure to a first removal etch, comprising the liner-removal etchant, wherein, in the first portion of the transistor structure, the isolation layer is etched at a third etch rate, less than the first etch rate.

3. The method of claim 2, further comprising performing a first epitaxial source/drain growth operation, wherein a first semiconductor material is grown on source/drain regions of the first portion of the transistor structure.

4. The method of claim 3, further comprising:
    subsequently to the first epitaxial source/drain growth operation, performing a second block lithography operation, wherein the second portion of the transistor structure, is unmasked, and wherein the first portion is masked;
    directing second angled ions at the transistor structure, wherein a second altered liner layer is created in a second portion of the liner layer, and the second altered liner layer exhibits an etch rate the same as the second etch rate;
    subjecting the transistor structure to a second removal etch, comprising the liner-removal etchant, wherein, in the second portion of the transistor structure, the isolation layer is etched at the third rate; and
    performing a second epitaxial source/drain growth operation, wherein a second semiconductor material is grown on source/drain regions of the second portion of the transistor structure.

5. The method of claim 1, wherein the ions form a non-zero angle of incidence with respect to a perpendicular to a plane of the substrate.

6. The method of claim 1, wherein the liner layer comprises silicon nitride, wherein the isolation layer comprises silicon oxide, and wherein the liner-removal etchant comprises HF.

7. The method of claim 6, wherein the liner layer comprises a thickness of 1 nm to 5 nm.

8. The method of claim 1, wherein the first angled ions comprise oxygen, nitrogen, fluorine, or argon.

9. The method of claim 1, wherein the first angled ions comprise an implant species, a first dose and a first ion energy, wherein after the directing the first angled ions, the first altered liner layer comprises a concentration of the implant species of 5 E20/cm$^3$ to 1 E22/cm$^3$.

10. The method of claim 9, wherein the first ion energy is 2 keV or less.

11. The method of claim 1, wherein the second etch rate is 200% or greater of the first etch rate.

12. The method of claim 1, wherein the liner layer comprises a gate sidewall portion, and a bottom portion, wherein the first angled ions implant into the gate sidewall portion and the bottom portion.

13. A method of forming a three-dimensional transistor device, comprising:
    forming a silicon nitride liner layer on a transistor structure of a fin-type field effect transistor device, the transistor structure comprising a fin assembly monolithically formed over a semiconductor base, and an isolation layer, above the semiconductor base, wherein the silicon nitride liner layer comprises a gate sidewall portion, and a bottom portion;
    directing first angled ions at the transistor structure, wherein the first angled ions implant into the gate sidewall portion and the bottom portion, wherein a first altered liner layer is created in the gate sidewall portion and the bottom portion;
    performing a first block lithography operation, wherein a first portion of the transistor structure, comprising device structures of a first polarity is unmasked, and wherein a second portion of the transistor structure, comprising device structures of a second polarity is masked;
    after performing the first block lithography operation, exposing the transistor structure to a liner-removal etchant in a first liner-removal etch, wherein the first altered liner layer is removed; and subsequently performing a first epitaxial source/drain growth operation, wherein a first semiconductor material is grown on source/drain regions of the first portion of the transistor structure.

14. The method of claim 13, further comprising:
subsequently to the first epitaxial source/drain growth operation, performing a second block lithography operation, wherein the second portion of the transistor structure, is unmasked, and wherein the first portion is masked;
directing second angled ions at the transistor structure, wherein a second altered liner layer is created in a second portion of the silicon nitride liner layer, wherein, in a presence of the liner-removal etchant, the silicon nitride liner layer exhibits a first etch rate, and the first altered liner layer and the second altered liner layer exhibits a second etch rate, greater than the first etch rate;
subjecting the transistor structure to a second liner-removal etch, comprising the liner-removal etchant, wherein, in the first liner-removal etch and the second liner-removal etch, an isolation layer disposed subjacent the silicon nitride liner layer is etched at a third etch rate, less than the second etch rate; and
performing a second epitaxial source/drain growth operation, wherein a second semiconductor material is grown on source/drain regions of the second portion of the transistor structure.

15. The method of claim 14, wherein the first angled ions and the second angled ions comprise oxygen, nitrogen, fluorine, or argon.

16. The method of claim 13, wherein the ions form a non-zero angle of incidence with respect to a perpendicular to a plane of a substrate, the substrate including the three-dimensional transistor device.

17. The method of claim 13, wherein the silicon nitride liner layer comprises a thickness of 1 nm to 5 nm.

18. A method of forming a three-dimensional transistor device, comprising:
forming a silicon nitride liner layer on a transistor structure of a fin-type field effect transistor device, the transistor structure comprising a fin assembly monolithically formed over a semiconductor base, and an isolation layer, above the semiconductor base, wherein the silicon nitride liner layer comprises a gate sidewall portion, and a bottom portion;
directing first angled ions in a first ion exposure at the transistor structure, wherein a first altered liner layer is created in the first silicon nitride layer, the first altered liner layer comprising implanted species derived from the first angled ions, wherein the implanted species exhibit a concentration of 5 E20/cm$^3$ to 1 E22/cm$^3$;
performing a first block lithography operation, wherein a first portion of the transistor structure, comprising device structures of a first polarity is unmasked, and wherein a second portion of the transistor structure, comprising device structures of a second polarity is masked; and
after performing the first block lithography operation exposing the transistor structure to a liner-removal etchant, wherein the first altered liner layer is removed in the first portion of the transistor structure.

* * * * *